(12) United States Patent
Chen et al.

(10) Patent No.: US 10,706,760 B2
(45) Date of Patent: Jul. 7, 2020

(54) SHIFT REGISTER, METHOD FOR DRIVING THE SAME, GATE DRIVER CIRCUIT, AND DISPLAY DEVICE

(71) Applicants: Hefei Xinsheng Optoelectronics Technology Co., Ltd., Hefei, Anhui (CN); BOE Technology Group., Ltd., Beijing (CN)

(72) Inventors: Kangxi Chen, Beijing (CN); Min Wang, Beijing (CN); Hui Dong, Beijing (CN); Hongjun Wang, Beijing (CN); Jianjun Wang, Beijing (CN)

(73) Assignees: Hefei Xinsheng Optoelectronics Technology Co., Ltd., Hefei, Anhui (CN); Boe Technology Group, Ltd, Beijing (CN)

( * ) Notice: Subject to any disclaimer, the term of this patent is extended or adjusted under 35 U.S.C. 154(b) by 0 days.

(21) Appl. No.: 16/328,384

(22) PCT Filed: Jun. 29, 2018

(86) PCT No.: PCT/CN2018/093854
§ 371 (c)(1),
(2) Date: Feb. 26, 2019

(87) PCT Pub. No.: WO2019/062245
PCT Pub. Date: Apr. 4, 2019

(65) Prior Publication Data
US 2020/0020264 A1 Jan. 16, 2020

(30) Foreign Application Priority Data
Sep. 27, 2017 (CN) .......................... 2017 1 0892460

(51) Int. Cl.
*G09G 3/20* (2006.01)
*G11C 19/28* (2006.01)
(Continued)

(52) U.S. Cl.
CPC ............... *G09G 3/20* (2013.01); *G11C 19/28* (2013.01); *G09G 2310/0267* (2013.01);
(Continued)

(58) Field of Classification Search
USPC ......................................................... 345/213
See application file for complete search history.

(56) References Cited

U.S. PATENT DOCUMENTS

2007/0040792 A1* 2/2007 Kwag .................. G09G 3/2092
345/100
2014/0092078 A1* 4/2014 Yoon .................... G09G 3/3677
345/212
(Continued)

FOREIGN PATENT DOCUMENTS

| CN | 104299590 | 1/2015 |
| CN | 104599620 | 5/2015 |

(Continued)

OTHER PUBLICATIONS

Notification of the First Office Action of International Application No. CN201710892460.3, Issue Serial No. 2019052101187180, dated May 24, 2019.

(Continued)

*Primary Examiner* — Amr A Awad
*Assistant Examiner* — Jonathan G Cooper
(74) *Attorney, Agent, or Firm* — Arent Fox LLP; Michael Fainberg

(57) ABSTRACT

A shift register, a method for driving the same, a gate driver circuit, and a display device are provided. The shift register includes an input circuit, a reset circuit, a first control circuit, a first output circuit, and a second output circuit, where the first output circuit includes two output channels, where one channel is that under the joint control of signals of a first clock signal terminal and a first node, a signal of a first clock (Continued)

signal terminal is provided to a drive signal output terminal of the shift register, and the other channel is that under the joint control of signals of the second clock signal terminal and the first node, a signal of a second clock signal terminal is provided to the drive signal output terminal.

17 Claims, 8 Drawing Sheets

(52) U.S. Cl.
CPC . *G09G 2310/0286* (2013.01); *G09G 2310/08* (2013.01); *G09G 2320/043* (2013.01)

(56) References Cited

U.S. PATENT DOCUMENTS

| | | |
|---|---|---|
| 2016/0125955 A1 | 5/2016 | Pang |
| 2016/0322115 A1 | 11/2016 | Xu et al. |
| 2018/0240529 A1 | 8/2018 | Wang |
| 2018/0268914 A1 | 9/2018 | Zhao et al. |

FOREIGN PATENT DOCUMENTS

| | | |
|---|---|---|
| CN | 104599629 | 5/2015 |
| CN | 104732950 | 6/2015 |
| CN | 104766586 | 7/2015 |
| CN | 105551422 | 5/2016 |
| CN | 105632562 | 6/2016 |
| CN | 105654991 | 6/2016 |
| CN | 106023919 | 10/2016 |
| CN | 106098101 | 11/2016 |
| CN | 106157912 | * 11/2016 |
| CN | 106504692 | 3/2017 |
| CN | 107610736 | 1/2018 |

OTHER PUBLICATIONS

Decision of Rejection of International Application No. CN201710892460.3, Issue Serial No. 2019073101560870, dated Aug. 5, 2019.

International Search Report, International Application No. PCT/CN2018/093854 dated Sep. 3, 2018.

* cited by examiner

SHIFT REGISTER, METHOD FOR DRIVING THE SAME, GATE DRIVER CIRCUIT, AND DISPLAY DEVICE

CROSS-REFERENCES TO RELATED APPLICATIONS

This disclosure is a US National Stage of International Application No. PCT/CN2018/093854, filed Jun. 29, 2018, which claims priority to Chinese Patent Application No. 201710892460.3, filed with the Chinese Patent Office on Sep. 27, 2017, and entitled "Shift register, Method for driving the same, Gate driver circuit, and Display device", which is hereby incorporated by reference in its entirety.

FIELD

This disclosure relates to the field of display technologies, and particularly to a shift register, a method for driving the same, a gate driver circuit, and a display device.

BACKGROUND

A typical gate driver circuit includes a plurality of cascaded shift registers, where a drive signal output terminal of each of the cascaded shift registers is connected with a corresponding gate line, and the respective shift registers input scan signals sequentially to the respective rows of gate lines on a display panel. In a shift register in the related art, an output transistor typically provides the drive signal output terminal with a high-level signal under the control of a pull-up node to output a valid scan signal, and while an image is being displayed on the display panel, the high-level signal is flowing through the same output transistor all the time, and a gate of the output transistor remains at the same bias for a long period of time, so that the characteristic of the output transistor may drift, and the service lifetime thereof may be shortened, so the stability of the shift register may be degraded, and the service lifetime thereof may be shortened, thus hindering the display panel from operating stably for a long period of time.

SUMMARY

An embodiment of the disclosure provides a shift register. The shift register includes: an input circuit configured to provide a first node with a signal of an input signal terminal under the control of the input signal terminal; a reset circuit configured to provide the first node with a signal of a reference voltage signal terminal under the control of a reset signal terminal; a first control circuit configured to control a level at the first node, and a level at a second node; a first output circuit configured to provide a drive signal output terminal of the shift register with a signal of a first clock signal terminal under the joint control of the signal of the first clock signal terminal and a signal of the first node, and to provide the drive signal output terminal with a signal of a second clock signal terminal under the joint control of the signal of the second clock signal terminal and the signal of the first node, wherein the signal of the first clock signal terminal and the signal of the second clock signal terminal have a same cycle, and opposite phases; and a second output circuit configured to provide the drive signal output terminal with the signal of the reference voltage signal terminal respectively under the control of the signal of the input signal terminal and a signal of the second node.

Optionally in the shift register according to the embodiment of this disclosure, the first output circuit includes a first switch transistor, a second switch transistor, a third switch transistor, a fourth switch transistor, and a storage capacitor, wherein the first switch transistor has a control electrode connected with the first node, a first electrode connected with the first clock signal terminal, and a second electrode connected with a control electrode of the second switch transistor, the second switch transistor has a first electrode connected with the first clock signal terminal, and a second electrode connected with the drive signal output terminal; the third switch transistor has a control electrode connected with the first node, a first electrode connected with the second clock signal terminal, and a second electrode connected with a control electrode of the fourth switch transistor, the fourth switch transistor has a first electrode connected with the second clock signal terminal, and a second electrode connected with the drive signal output terminal; and the storage capacitor is connected between the first node and the drive signal output terminal.

Optionally in the shift register according to the embodiment of this disclosure, the input circuit includes a fifth switch transistor, wherein the fifth switch transistor has a control electrode and a first electrode, both of which are connected with the input signal terminal, and a second electrode connected with the first node.

Optionally in the shift register according to the embodiment of this disclosure, the reset circuit includes a sixth switch transistor, wherein the sixth switch transistor has a control electrode connected with the reset signal terminal, a first electrode connected with the reference voltage signal terminal, and a second electrode connected with the first node.

Optionally in the shift register according to the embodiment of this disclosure, the second output circuit includes a seventh switch transistor and an eighth switch transistor, wherein the seventh switch transistor has a control electrode connected with the second node, a first electrode connected with the reference voltage signal terminal, and a second electrode connected with the drive signal output terminal; and the eighth switch transistor has a control electrode connected with the input signal terminal, a first electrode connected with the reference voltage signal terminal, and a second electrode connected with the drive signal output terminal.

Optionally in the shift register according to the embodiment of this disclosure, the first control circuit includes a ninth switch transistor, a tenth switch transistor, an eleventh switch transistor, a twelfth h switch transistor, and a thirteenth switch transistor, wherein the ninth switch transistor has a control electrode connected with the second node, a first electrode connected with the reference voltage signal terminal, and a second electrode connected with the first node; the tenth switch transistor has a control electrode and a first electrode, both of which are connected with a first node control signal terminal, and a second electrode connected with a control electrode of the eleventh switch transistor; the eleventh switch transistor has a first electrode connected with the first node control signal terminal, and a second electrode connected with the second node; the twelfth switch transistor has a control electrode connected with the first node, a first electrode connected with the reference voltage signal terminal, and a second electrode connected with the control electrode of the eleventh switch transistor, and the thirteenth switch transistor has a control electrode connected with the first node, a first electrode connected with the reference voltage signal terminal, and a second electrode connected with the second node.

Optionally in the shift register according to the embodiment of this disclosure, the signal of the first clock signal terminal has a cycle of four seconds, and a duty cycle of 50%.

Optionally in the shift register according to the embodiment of this disclosure, the shift register further includes a second control circuit and a third output circuit, wherein the second control circuit is configured to control the level at the first node, and a level at a third node; and the third output circuit is configured to provide the drive signal output terminal with the signal of the reference voltage signal terminal under the control of the signal of the third node.

Optionally in the shift register according to the embodiment of this disclosure, the second control circuit includes a fourteenth switch transistor, a fifteenth switch transistor, a sixteenth switch transistor, a seventeenth switch transistor, and an eighteenth switch transistor, wherein the fourteenth switch transistor has a control electrode connected with the third node, a first electrode connected with the reference voltage signal terminal, and a second electrode connected with the first node; the fifteenth switch transistor has a control electrode and a first electrode, both of which are connected with a second node control signal terminal, and a second electrode connected with a control electrode of the sixteenth switch transistor; the sixteenth switch transistor has a first electrode connected with the second node control signal terminal, and a second electrode connected with the third node; the seventeenth switch transistor has a control electrode connected with the first node, a first electrode connected with the reference voltage signal terminal, and a second electrode connected with the control electrode of the sixteenth switch transistor; and the eighteenth switch transistor has a control electrode connected with the first node, a first electrode connected with the reference voltage signal terminal, and a second electrode connected with the third node.

Optionally in the shift register according to the embodiment of this disclosure, a signal of the first node control signal terminal, and a signal of the second node control signal terminal are clock signals; and the signal of the first node control signal terminal and the signal of the second node control signal terminal have a same cycle, and opposite phases.

Optionally in the shift register according to the embodiment of this disclosure, the third output circuit includes a nineteenth switch transistor, wherein the nineteenth switch transistor has a control electrode connected with the third node, a first electrode connected with the reference voltage signal terminal, and a second electrode connected with the drive signal output terminal.

Optionally in the shift register according to the embodiment of this disclosure, the shift register further includes an output stabilizing circuit configured to provide the drive signal output terminal with the signal of the reference voltage signal terminal under the control of the reset signal terminal.

Optionally in the shift register according to the embodiment of this disclosure, the output stabilizing circuit includes a twentieth switch transistor, wherein the twentieth switch transistor has a control electrode connected with the reset signal terminal, a first electrode connected with the reference voltage signal terminal, and a second electrode connected with the drive signal output terminal.

Correspondingly an embodiment of this disclosure further provides a method for driving the shift register above. The method includes: inputting signals with a same cycle and opposite phases to the first clock signal terminal and the second clock signal terminal.

Correspondingly an embodiment of this disclosure further provides a gate driver circuit. The gate driver circuit includes a plurality of cascaded shift registers according to any one of the embodiments above of this disclosure. An input signal terminal of a first stage of the shift register is connected with a first frame trigger signal terminal; an input signal terminal of a second stage of the shift register is connected with a second frame trigger signal terminal; an input signal terminal of a third stage of the shift register is connected with a third frame trigger signal terminal; of every four adjacent shift registers, an input signal terminal of a fourth shift register is connected with the drive signal output terminal of a first shift register; and of every five adjacent shift registers, a reset signal terminal of the first shift register is connected with the drive signal output terminal of a fifth shift register.

Optionally in the gate driver circuit according to the embodiment of this disclosure, a first clock signal terminal of each stage of the shift register is connected with a first clock terminal, and a second clock signal terminal of each stage of the shift register is connected with a second clock terminal.

Correspondingly an embodiment of this disclosure further provides a display device including the gate driver circuit according to any one of the embodiments above of this disclosure.

BRIEF DESCRIPTION OF THE DRAWINGS

FIG. 4a is an input-output timing diagram corresponding to the shift register as illustrated in FIG. 3a;

DETAILED DESCRIPTION

In order to make the objects, the technical solutions, and the advantages of this disclosure more apparent, specific implementations of the shift register, the gate driver circuit, and the display device according to the embodiments of this disclosure will be described below in details with reference to the drawings. It shall be appreciated that the preferable embodiments to be described below are only intended to illustrate and explain this disclosure, but not to limit this disclosure thereto. The embodiments of this disclosure, and the features in the embodiments can be combined with each other unless they conflict with each other.

Figure 1:
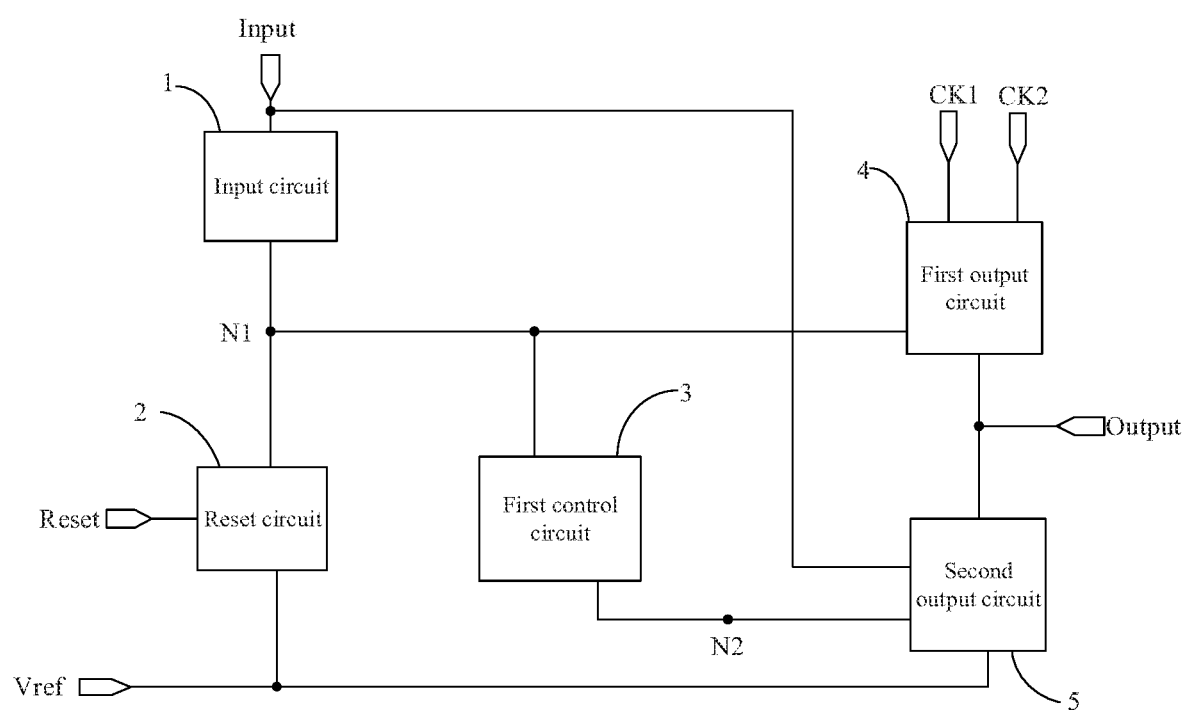
FIG. 1 is a schematic structural diagram of a shift register according to some embodiments of this disclosure.

As illustrated in FIG. 1, a shift register according to an embodiment of this disclosure includes: an input circuit 1, a reset circuit 2, a first control circuit 3, a first output circuit 4, and a second output circuit 5.

The input circuit 1 is configured to provide a first node N1 with a signal of an input signal terminal Input under the control of the input signal terminal Input.

The reset circuit 2 is configured to provide the first node N1 with a signal of a reference voltage signal terminal Vref under the control of a reset signal terminal Reset.

The first control circuit 3 is configured to control the level at the first node N1, and the level at a second node N2.

The first output circuit 4 is configured to provide a drive signal output terminal Output of the shift register with a signal of a first clock signal terminal CK1 under the joint control of the signals of the first clock signal terminal CK1 and the first node N1, and to provide the drive signal output terminal Output with a signal of a second clock signal terminal CK2 under the joint control of the signals of the second clock signal terminal CK2 and the first node N1, where the signal of the first clock signal terminal CK1, and the signal of the second clock signal terminal CK2 have the same cycle, and opposite phases.

The second output circuit 5 is configured to provide the drive signal output terminal Output with the signal of the reference voltage signal terminal Vref respectively under the control of the signal of the input signal terminal Input and the signal of the second node N2.

In the shift register according to the embodiment of this disclosure, the first output circuit 4 includes two output channels, where in one channel, under the joint control of the signals of the first clock signal terminal CK1 and the first node N1, the signal of the first clock signal terminal CK1 is provided to the drive signal output terminal Output of the shift register, and in the other channel, under the joint control of the signals of the second clock signal terminal CK2 and the first node N1, the signal of the second clock signal terminal CK2 is provided to the drive signal output terminal Output, and the first output circuit cooperates with the other four circuits so that these two channels can operate alternately to thereby avoid current from flowing through only one of the channels so as to improve the service lifetime of the shift register.

In a specific implementation, in the shift register according to the embodiment of this disclosure, the cycle of the signal of the first clock signal terminal CK1 can be M seconds, where M is a positive number, or the cycle of the signal of the first clock signal terminal CK1 can alternatively be a period of time of N frames, where N is a positive integer, or the cycle of the signal of the first clock signal terminal CK1 can alternatively be a period of time of scanning K rows of pixels, where K is a positive integer.

Optionally in the shift register according to the embodiment of this disclosure, the cycle of the signal of the first clock signal terminal CK1 can be four seconds, and the duty cycle of the signal of the first clock signal terminal CK1 can be 50%. In a display device with a refresh frequency of 60 Hz, four seconds can include a period of time for displaying 240 frames. Of course, in a real application, the cycle of the signal of the first clock signal terminal CK1 can be designed as needed in a real application context, although the embodiment of this disclosure will not be limited thereto.

In a specific implementation, in the shift register according to the embodiment of this disclosure, as illustrated in FIG. 1, the input circuit 1 is connected respectively with the input signal terminal Input and the first node N1; the reset circuit 2 is connected respectively with the reset signal terminal Reset, the reference voltage signal terminal Vref, and the first node N1; the first control circuit 3 is connected respectively with the first node N1 and the second node N2; the first output circuit 4 is connected respectively with the first cock signal terminal CK1, the first node N1, the drive signal output terminal Output of the shift register, and the second clock signal terminal CK2; and the second output circuit 5 is connected respectively with the input signal terminal Input, the second node N2, the reference voltage signal terminal Vref, and the drive signal output terminal Output.

In a specific implementation, in the shift register according to the embodiment of this disclosure, a valid pulse signal of the input signal terminal Input is a high-level signal, and the signal of the reference voltage signal terminal Vref can be a low-level signal. Or a valid pulse signal of the input signal terminal Input is a low-level signal, and the signal of the reference voltage signal terminal Vref can be a high-level signal.

This disclosure will be described below in details in connection with a specific embodiment thereof. It shall be noted that this embodiment is only intended to better explain this disclosure, but not to limit this disclosure thereto.

Figure 3A:
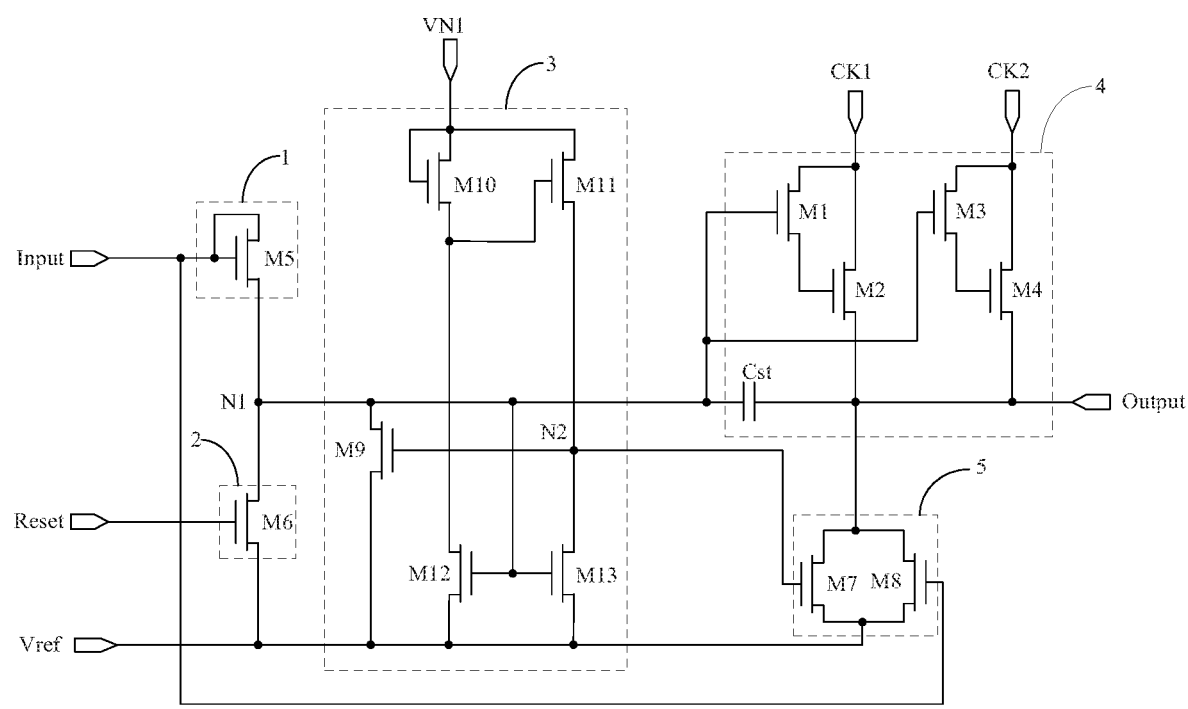
FIG. 3a is a schematic structural diagram in details of a shift register according to some embodiments of this disclosure.
Figure 3B:
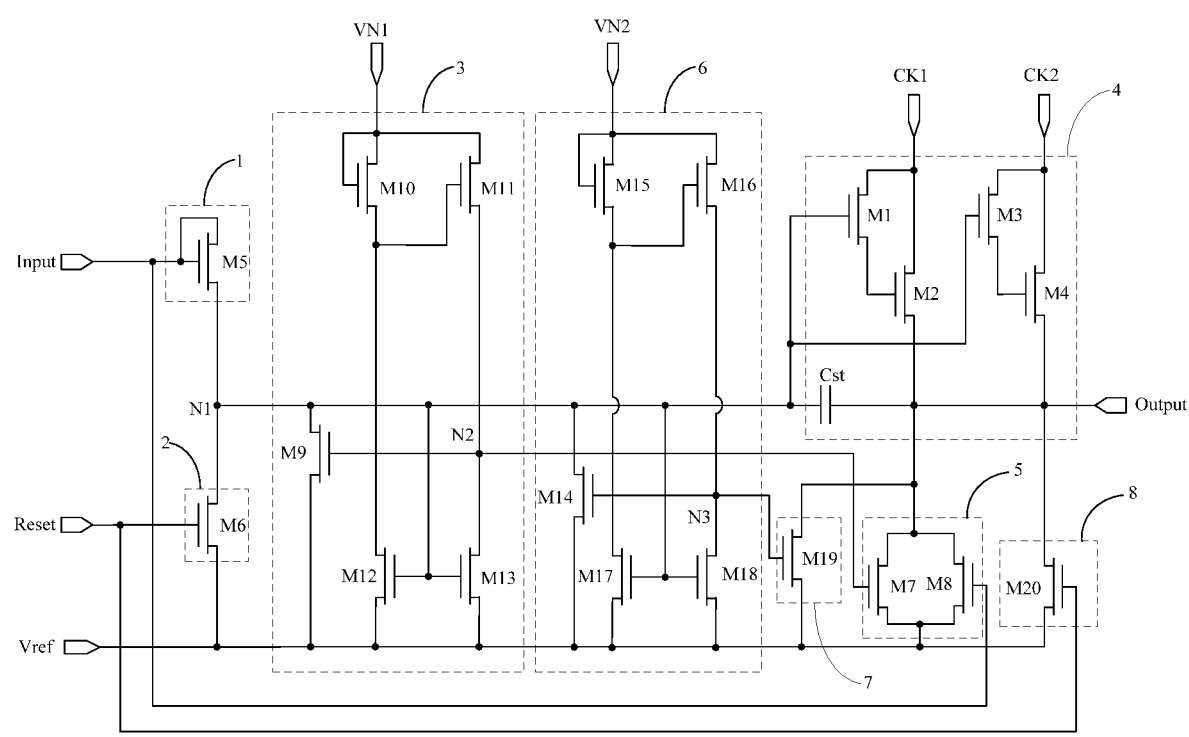
FIG. 3b is a schematic structural diagram in details of a shift register according to some embodiments of this disclosure.

Optionally in the shift register according to the embodiment of this disclosure, as illustrated in FIG. 3a and FIG. 3b, the input circuit 1 can include a fifth switch transistor M5.

The fifth switch transistor M5 has a control electrode and a first electrode, both of which are connected with the input signal terminal Input, and a second electrode connected with the first node N1.

In a specific implementation, as illustrated in FIG. 3a and FIG. 3b, the fifth switch transistor M5 can be an N-type transistor, or the fifth switch transistor M5 can alternatively be a P-type transistor, although the embodiment of this disclosure will not be limited thereto.

Optionally in the shift register according to the embodiment of this disclosure, as illustrated in FIG. 3a and FIG. 3b, the reset circuit 2 can include a sixth switch transistor M6.

The sixth switch transistor M6 has a control electrode connected with the reset signal terminal Reset, a first electrode connected with the reference voltage signal terminal Vref, and a second electrode connected with the first node N1.

In a specific implementation, as illustrated in FIG. 3a and FIG. 3b, the sixth switch transistor M6 can be an N-type transistor; or the sixth switch transistor M6 can alternatively be a P-type transistor, although the embodiment of this disclosure will not be limited thereto.

Specifically the first control circuit 3 is configured to control the levels at the first node N1 and the second node N2. Taking as an example the valid pulse signal of the input signal terminal Input being a high-level signal, the first control circuit 3 can be configured so that during a frame is being displayed, the level at the first node N1 is a high level and the level at the second node N2 is a low level, from the start of an input to the end of an output, and the level at the first node N1 is a low level and the level at the second node N2 is a high level, from the end of the output to the start of an input of the next frame, without departing from the claimed scope of this disclosure, although the embodiment of this disclosure will not be limited thereto.

Optionally in the shift register according to the embodiment of this disclosure, as illustrated in FIG. 3a and FIG. 3b, the first control circuit 3 can include a ninth switch transistor M9, a tenth switch transistor M10, an eleventh switch transistor M11, a twelfth switch transistor M12, and a thirteenth switch transistor M13.

The ninth switch transistor M9 has a control electrode connected with the second node N2, a first electrode connected with the reference voltage signal terminal Vref, and a second electrode connected with the first node N1.

The tenth switch transistor M10 has a control electrode and a first electrode, both of which are connected with a first node control signal terminal VN1, and a second electrode connected with a control electrode of the eleventh switch transistor M11.

The eleventh switch transistor M11 has a first electrode connected with the first node control signal terminal VN1, and a second electrode connected with the second node N2.

The twelfth switch transistor M12 has a control electrode connected with the first node N1, a first electrode connected with the reference voltage signal terminal Vref, and a second electrode connected with the control electrode of the eleventh switch transistor M11.

The thirteenth switch transistor M13 has a control electrode connected with the first node N1, a first electrode connected with the reference voltage signal terminal Vref, and a second electrode connected with the second node N2.

In a specific implementation, when the valid pulse signal of the input signal terminal Input is a high-level signal, a signal of the first node control signal terminal VN1 can be a high-level signal, and when the valid pulse signal of the input signal terminal Input is a low-level signal, the signal of the first node control signal terminal VN1 can be a low-level signal. Of course, the signal of the first node control signal terminal VN1 can alternatively be a clock signal, although the embodiment of this disclosure will not be limited thereto.

In a specific implementation, when being fabricated, the size of the twelfth switch transistor M12 is typically arranged to be larger than the size of the tenth switch transistor M10 so that when the level at the first node N1 is a high level, the rate at which the twelfth switch transistor M12 provides the control electrode of the eleventh switch transistor M11 with the signal of the reference voltage signal terminal Vref under the control of the signal of the first node N1 is higher than the rate at which the tenth switch transistor M10 provides the control electrode of the eleventh switch transistor M11 with the signal of the first node control signal terminal VN1 under the control of the first node control signal terminal VN1, so that the level at the second node N2 is a low level.

In a specific implementation, as illustrated in FIG. 3a and FIG. 3b, the ninth switch transistor M9, the tenth switch transistor M10, the eleventh switch transistor M11, the twelfth switch transistor M12, and the thirteenth switch transistor M13 can be N-type transistors, or the ninth switch transistor M9, the tenth switch transistor M10, the eleventh switch transistor M11, the twelfth switch transistor M12, and the thirteenth switch transistor M13 can be P-type transistors, although the embodiment of this disclosure will not be limited thereto.

Optionally in the shift register according to the embodiment of this disclosure, as illustrated in FIG. 3a and FIG. 3b, the first output circuit 4 can include a first switch transistor M1, a second switch transistor M2, a third switch transistor M3, a fourth switch transistor M4, and a storage capacitor Cst.

The first switch transistor M1 has a control electrode connected with the first node N1, a first electrode connected with the first clock signal terminal CK1, and a second electrode connected with a control electrode of the second switch transistor M2.

The second switch transistor M2 has a first electrode connected with the first clock signal terminal CK1, and a second electrode connected with the drive signal output terminal Output.

The third switch transistor M3 has a control electrode connected with the first node N1, a first electrode connected with the second clock signal terminal CK2, and a second electrode connected with a control electrode of the fourth switch transistor M4.

The fourth switch transistor M4 has a first electrode connected with the second clock signal terminal CK2, and a second electrode connected with the drive signal output terminal Output.

The storage capacitor Cst is connected between the first node N1 and the drive signal output terminal Output, where the storage capacitor Cst can be charged or discharged under the control of the signals of the first node N1 and the drive signal output terminal Output, and a stable voltage difference between the first node N1 and the drive signal output terminal Output can be maintained due to bootstrapping of the storage capacitor Cst.

In a specific implementation, as illustrated in FIG. 3a and FIG. 3b, the first switch transistor M1, the second switch transistor M2, the third switch transistor M3, and the fourth switch transistor M4 can be N-type transistors, or the first switch transistor M1, the second switch transistor M2, the third switch transistor M3, and the fourth switch transistor M4 can be P-type transistors, although the embodiment of this disclosure will not be limited thereto.

Optionally in the shift register according to the embodiment of this disclosure, as illustrated in FIG. 3a and FIG. 3b, the second output circuit 5 can include a seventh switch transistor M7 and an eighth switch transistor M8.

The seventh switch transistor M7 has a control electrode connected with the second node N2, a first electrode connected with the reference voltage signal terminal Vref, and a second electrode connected with the drive signal output terminal Output.

The eighth switch transistor M8 has a control electrode connected with the input signal terminal Input, a first electrode connected with the reference voltage signal terminal Vref, and a second electrode connected with the drive signal output terminal Output.

In a specific implementation, as illustrated in FIG. 3a and FIG. 3b, the seventh switch transistor M7 and the eighth switch transistor M8 can be N-type transistors, or the seventh switch transistor M7 and the eighth switch transistor M8 can be P-type transistors, although the embodiment of this disclosure will not be limited thereto.

Figure 2:
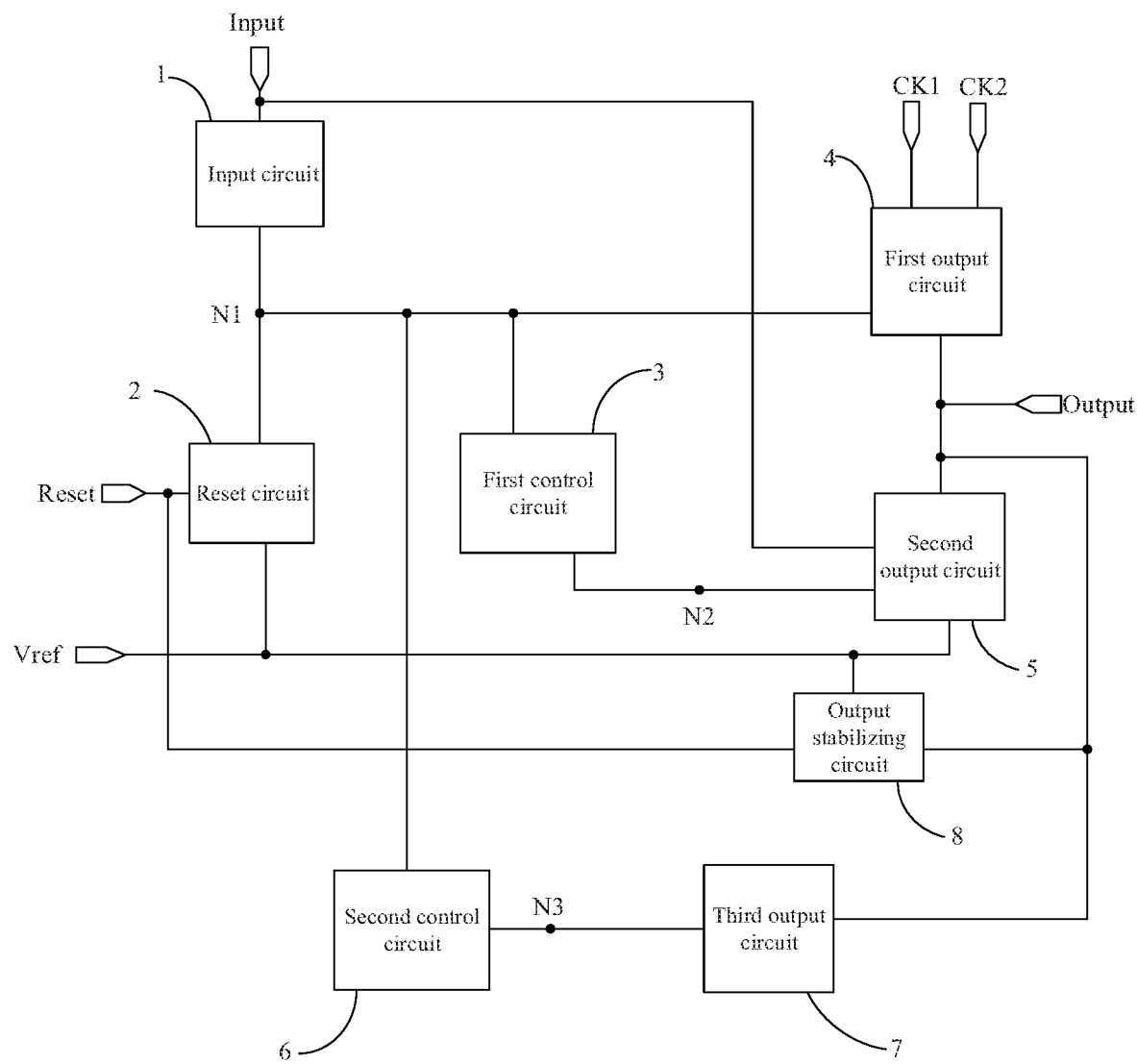
FIG. 2 is a schematic structural diagram of a shift register according to some embodiments of this disclosure.

In order to avoid the switch transistors in the first control circuit 4 and the second output circuit 5 from operating for such a long period of time that the characteristics of the switch transistors may drift and even be damaged, optionally in the shift register according to the embodiment of this disclosure, as illustrated in FIG. 2, the shift register can further include a second control circuit 6 and a third output circuit 7.

The second control circuit 6 is configured to control the level at the first node N1, and the level at the third node N3.

The third output circuit 7 is configured to provide the drive signal output terminal Output with the signal of the reference voltage signal terminal Vref under the control of the signal of the third node N3.

In this way, the first control circuit 3 and the second control circuit 6 can operate alternately, and the second output circuit 5 and the third output circuit 7 can operate alternately, thus avoiding the switch transistors in the first control circuit 4 and the second output circuit 5 from operating for such a long period of time that the characteristics of the switch transistors may drift and even be damaged.

Optionally in the shift register according to the embodiment of this disclosure, as illustrated in FIG. 3b, the second control circuit 6 can include a fourteenth switch transistor M14, a fifteenth switch transistor M15, a sixteenth switch transistor M16, a seventeenth switch transistor M17, and an eighteenth switch transistor M18.

The fourteenth switch transistor M14 has a control electrode connected with the third node N3, a first electrode connected with the reference voltage signal terminal Vref, and a second electrode connected with the first node N1.

The fifteenth switch transistor M15 has a control electrode and a first electrode, both of which are connected with a second node control signal terminal VN2, and a second electrode connected with a control electrode of the sixteenth switch transistor M16.

The sixteenth switch transistor M16 has a first electrode connected with the second node control signal terminal VN2, and a second electrode connected with the third node N3.

The seventeenth switch transistor M17 has a control electrode connected with the first node N1, a first electrode connected with the reference voltage signal terminal Vref, and a second electrode connected with the control electrode of the sixteenth switch transistor M16.

The eighteenth switch transistor M18 has a control electrode connected with the first node N1, a first electrode connected with the reference voltage signal terminal Vref, and a second electrode connected with the third node N3.

In a specific implementation, as illustrated in FIG. 3b, the fourteenth switch transistor M14, the fifteenth switch transistor M15, the sixteenth switch transistor M16, the seventeenth switch transistor M17, and the eighteenth switch transistor M18 can be N-type transistors, or the fourteenth switch transistor M14, the fifteenth switch transistor M15, the sixteenth switch transistor M16, the seventeenth switch transistor M17, and the eighteenth switch transistor M18 can be P-type transistors, although the embodiment of this disclosure will not be limited thereto.

In a specific implementation, when the shift register according to the embodiment of this disclosure further includes the second control circuit 6, in the shift register according to the embodiment of this disclosure, the signal of the first node control signal terminal VN1, and the signal of the second node control signal terminal VN2 can be clock signals respectively; and the signal of the first node control signal terminal VN1 and the signal of the second node control signal terminal VN2 have the same cycle, and opposite phases.

In a specific implementation, in order to reduce the number of signal terminals, and to lower a space to be occupied for wiring, in the shift register according to the embodiment of this disclosure, the signal of the first node control signal terminal VN1 may be the same as the signal of the first clock signal terminal CK1, that is, the first node control signal terminal VN1 is the same signal terminal as the first clock signal terminal CK1; or they may be different. Of course, in a real application, the first node control signal terminal VN1 shall be designed as needed in a real application context, although the embodiment of this disclosure will not be limited thereto.

In a specific implementation, when being fabricated, the size of the seventeenth switch transistor M17 is arranged to be larger than the size of the fifteenth switch transistor M15 so that when the level at the first node N1 is a high level, the rate at which the seventeenth switch transistor M17 provides the control electrode of the sixteenth switch transistor M16 with the signal of the reference voltage signal terminal Vref under the control of the signal of the first node N1 is higher than the rate at which the fifteenth switch transistor M15 provides the control electrode of the sixteenth switch transistor M16 with the signal of the second node control signal terminal VN2 under the control of the second node control signal terminal VN2, so that the level at the third node N3 is a low level.

Optionally in the shift register according to the embodiment of this disclosure, as illustrated in FIG. 3b, the third output circuit 7 can include a nineteenth switch transistor M19.

The nineteenth switch transistor M19 has a control electrode connected with the third node N3, a first electrode connected with the reference voltage signal terminal Vref, and a second electrode connected with the drive signal output terminal Output.

In a specific implementation, as illustrated in FIG. 3b, the nineteenth switch transistor M19 can be an N-type transistor, or the nineteenth switch transistor M19 can be a P-type transistor, although the embodiment of this disclosure will not be limited thereto.

In order to make the level at the drive signal output terminal Output opposite in phase to the level of a valid pulse signal timely after the drive signal output terminal Output outputs the valid pulse signal, optionally in the shift register according to the embodiment of this disclosure, as illustrated in FIG. 2, the shift register can further include an output stabilizing circuit 8 configured to provide the drive signal output terminal Output with the signal of the reference voltage signal terminal Vref under the control of the reset signal terminal Reset.

Optionally in the shift register according to the embodiment of this disclosure, as illustrated in FIG. 3b, the output stabilizing circuit can include a twentieth switch transistor M20.

The twentieth switch transistor M20 has a control electrode connected with the reset signal terminal Reset, a first electrode connected with the reference voltage signal terminal Vref, and a second electrode connected with the drive signal output terminal Output.

In a specific implementation, as illustrated in FIG. 3b, the twentieth switch transistor M20 can be an N-type transistor, or the twentieth switch transistor M20 can be a P-type transistor, although the embodiment of this disclosure will not be limited thereto.

The specific structures of the respective circuits in the shift register according to the embodiment of this disclosure have been described above only by way of an example, and in an implementation, the specific structures of the respective circuits above will not be limited to the structures above according to the embodiment of this disclosure, but can be other structures which can occur to those skilled in the art, although the embodiment of this disclosure will not be limited thereto.

In order to simplify a fabrication process, in an implementation, in the shift register according to the embodiment of this disclosure, as illustrated in FIG. 3a and FIG. 3b, all the switch transistors can be N-type switch transistors, or all the switch transistors can be P-type switch transistors, although the embodiment of this disclosure will not be limited thereto.

In an implementation, in the shift register according to the embodiment of this disclosure, an N-type switch transistor is turned on by a high-level signal, and turned off by a low-level signal; and a P-type switch transistor is turned on by a low-level signal, and turned off by a high-level signal.

It shall be noted that the switch transistors as referred to in the embodiment above of this disclosure can be Thin Film Transistors (TFTs), or can be Metal Oxide Semiconductor Field Effect Transistors (MOSFETs), although the embodiment of this disclosure will not be limited thereto.

An operating process of the shift register above according to the embodiment of this disclosure will be described below in details in connection with a circuit timing diagram thereof.

In the following description, 1 represents a high-level signal, and 0 represents a low-level signal, where 1 and 0 represent logic levels, and are only intended to better explain the operating process of the shift register above according to the embodiment of this disclosure, but not to suggest any levels applied to the gates of the respective switch transistors in a specific implementation. Furthermore the signal of the first clock signal terminal CK1 has a cycle of four seconds, and a duty cycle of 50%, for example, throughout the following description.

First Embodiment

Figure 4A:
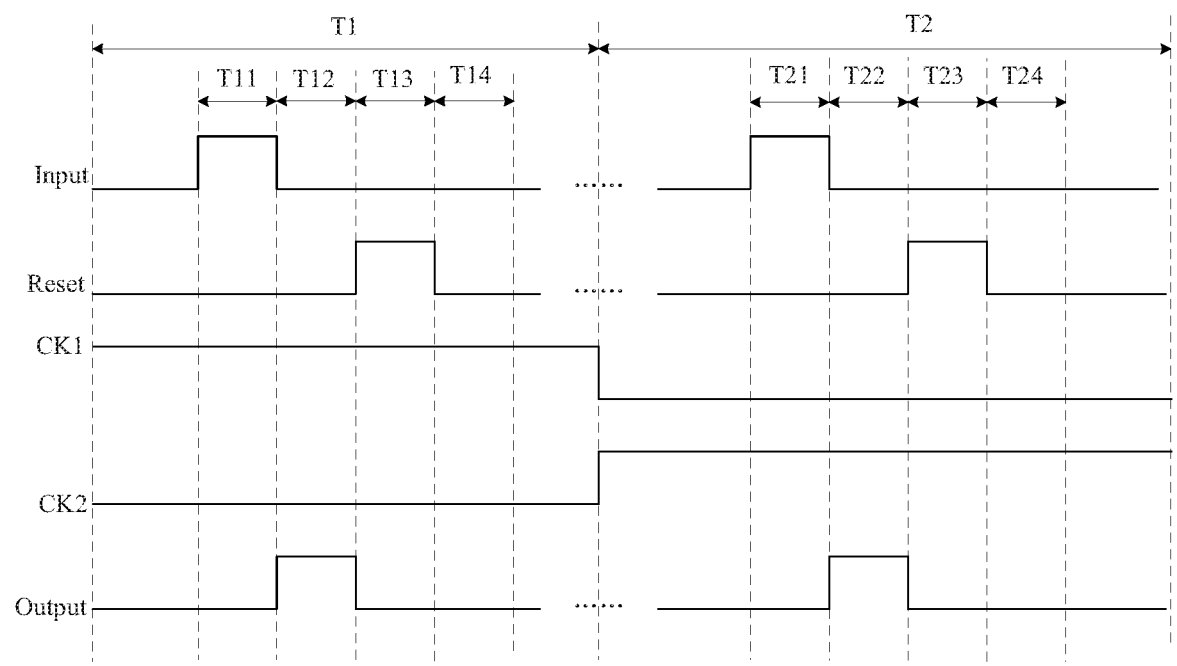

Taking the shift register as illustrated in FIG. 3a as an example, all the transistors are N-type transistors; the signal of the reference voltage signal terminal Vref is a low-level signal, and the signal of the first node control signal terminal VN1 is a high-level signal; and FIG. 4a illustrates a corresponding input-output timing diagram. Specifically there are two selected periods T1 and T2 in the corresponding input-output timing diagram as illustrated in FIG. 4a, where the period T1 and the period T2 correspond respectively to two seconds in a cycle of the signal of the first clock signal terminal CK1. Furthermore there are four selected periods T11, T12, T13, and T14 in a time period for displaying one frame in the period T1, and four selected periods T21, T22, T23, and T24 in a time period for displaying one frame in the period T2.

In the period T11, Input=1, Reset=0, CK1=1, and CK2=0. With Input=1, both the fifth switch transistor M5 and the eighth switch transistor M8 are turned on. The turned-on fifth switch transistor M5 provides the first node N1 with the high-level signal of the input signal terminal Input, so that the signal of the first node N1 is a high-level signal to control all of the first switch transistor M1, the third switch transistor M3, the twelfth switch transistor M12, and the thirteenth switch transistor M13 to be turned on. The turned-on twelfth switch transistor M12 provides the control electrode of the eleventh switch transistor M11 with the low-level signal of the reference voltage signal terminal Vref to control the eleventh switch transistor M11 to be turned off. The turned-on thirteenth switch transistor M13 provides the second node n2 with the low-level signal of the reference voltage signal terminal Vref, so that the signal of the second node N2 is a low-level signal to control both the seventh switch transistor M7 and the ninth switch transistor M9 to be turned off. The turned-on third switch transistor M3 provides the control electrode of the fourth switch transistor M4 with the low-level signal of the second clock signal terminal CK2 to control the fourth switch transistor M4 to be turned off. The turned-on eighth switch transistor M8 electrically connects the reference voltage signal terminal Vref with the drive signal output terminal Output so that the storage capacitor Cst is charged, and the drive signal output terminal Output outputs a scan signal at a low level. Although at this time the turned-on first switch transistor M1 provides the control electrode of the second switch transistor M2 with the high-level signal of the first clock signal terminal CK1 to control the second switch transistor M2 to be turned on, and to provide the drive signal output terminal Output with the high-level signal of the first clock signal terminal CK1, but since the first clock signal terminal CK1 is connected directly with the reference voltage signal terminal Vref, the signal of the first clock signal terminal CK1 may not affect the signal of the drive signal output terminal Output. With Reset=0, the sixth switch transistor M6 is turned off.

In the period T12, Input=0, Reset=0, CK1=1, and CK2=0. With Input=0, both the fifth switch transistor M5 and the eighth switch transistor M8 are turned off. With Reset=0, the sixteenth switch transistor M6 is turned off, so the first node N1 is floating, and due to bootstrapping of the storage capacitor Cst, the level at the first node N1 can be maintained at a high level to control all of the first switch transistor M1, the third switch transistor M3, the twelfth switch transistor M12, and the thirteenth switch transistor M13 to be turned on. The turned-on first switch transistor M1 provides the control electrode of the second switch transistor M2 with the high-level signal of the first clock signal terminal CK1 to control the second switch transistor M2 to be turned on, and to provide the drive signal output terminal Output with the high-level signal of the first clock signal terminal CK1. Due to bootstrapping of the storage capacitor Cst, the level at the first node N1 is further pulled up to control all of the first switch transistor M1, the third switch transistor M3, the twelfth switch transistor M12, and the thirteenth switch transistor M13 to be turned on completely. The turned-on twelfth switch transistor M12 provides the control electrode of the eleventh switch transistor M11 with the low-level signal of the reference voltage signal terminal Vref to control the eleventh switch transistor M11 to be turned off. The turned-on thirteenth switch transistor M13 provides the second node N2 with the low-level signal of the reference voltage signal terminal Vref so that the signal of the second node N2 is a low-level signal to control both the seventh switch transistor M7 and the ninth switch transistor M9 to be turned off. The turned-on third switch transistor M3 provides the control electrode of the fourth switch transistor M4 with the low-level signal of the second clock signal terminal CK2 to control the fourth switch transistor M4 to be turned off. The turned-on first switch transistor M1 provides the control electrode of the second switch transistor M2 with the high-level signal of the first clock signal terminal CK1 without any voltage loss to control the second switch transistor M2 to be turned on completely, and to provide the drive signal output terminal Output with the high-level signal of the first clock signal terminal CK1 without any voltage loss so that the drive signal output terminal Output outputs a scan signal at a high level.

In the period T13, Input=0, Reset=11, CK1=1, and CK2=0. With Input=0, both the fifth switch transistor M5 and the eighth switch transistor M8 are turned off. With Reset=1, the sixteenth switch transistor M6 is turned on, and provides the first node N1 with the low-level signal of the reference voltage signal terminal Vref so that the signal of the first node N1 is a low-level signal to control all of the first switch transistor M1, the third switch transistor M3, the twelfth switch transistor M12, and the thirteenth switch transistor M13 to be turned off. Since the signal of the first node control signal terminal VN1 is a high-level signal, the tenth switch transistor M10 is controlled to be turned on and provides the eleventh switch transistor M11 with the high-level signal of the first node control signal terminal VN1, to control the eleventh switch transistor M11 to be turned on, and to provide the second node N2 with the high-level signal of the first node control signal terminal VN1 so that the signal of the second node N2 is a high-level signal to control both the seventh switch transistor M7 and the ninth switch transistor M9 to be turned on. The turned-on ninth switch transistor M9 provides the first node N1 with the low-level signal of the reference voltage signal terminal Vref so that the signal of the first node N1 is a further low-level signal. The turned-on seventh switch transistor M7 provides the drive signal output terminal Output with the low-level signal of the reference voltage signal terminal Vref so that the drive signal output terminal Output outputs a scan signal at a low level.

In the period T14, Input=0, Reset=0, CK1=1, and CK2=0. With Input=0, both the fifth switch transistor M5 and the eighth switch transistor M8 are turned off. With Reset=0, the sixteenth switch transistor M6 is turned off. Since the signal of the first node control signal terminal VN1 is a high-level signal, the tenth switch transistor M10 is controlled to be turned on, and provides the eleventh switch transistor M11 with the high-level signal of the first node control signal terminal VN1, to control the eleventh switch transistor M11 to be turned on, and to provide the second node N2 with the high-level signal of the first node control signal terminal VN1 so that the signal of the second node N2 is a high-level signal to control both the seventh switch transistor M7 and the ninth switch transistor M9 to be turned on. The turned-on ninth switch transistor M9 provides the first node N1 with the low-level signal of the reference voltage signal terminal Vref so that the signal of the first node N1 is a low-level signal to control all of the first switch transistor M1, the third switch transistor M3, the twelfth switch transistor M12, and the thirteenth switch transistor M13 to be turned off. The turned-on seventh switch transistor M7 provides the drive signal output terminal Output with the low-level signal of the reference voltage signal terminal Vref so that the drive signal output terminal Output outputs a scan signal at a low level.

In the period T1, the operating process in the period T14 is repeated after the period T14 until the signal of the input signal terminal Input is changed again to a high-level signal.

In the period T21, Input=1, Reset=0, CK1=, and CK2=1. With Input=1, both the fifth switch transistor M5 and the eighth switch transistor M8 are turned on. The turned-on fifth switch transistor M5 provides the first node N1 with the high-level signal of the input signal terminal Input, so that the signal of the first node N1 is a high-level signal to control all of the first switch transistor M1, the third switch transistor M3, the twelfth switch transistor M12, and the thirteenth switch transistor M13 to be turned on. The turned-on twelfth switch transistor M12 provides the control electrode of the eleventh switch transistor M11 with the low-level signal of the reference voltage signal terminal Vref to control the eleventh switch transistor M11 to be turned off. The turned-on thirteenth switch transistor M13 provides the second node N2 with the low-level signal of the reference voltage signal terminal Vref so that the signal of the second node N2 is a low-level signal to control both the seventh switch transistor M7 and the ninth switch transistor M9 to be turned off. The turned-on first switch transistor M1 provides the control electrode of the second switch transistor M2 with the low-level signal of the first clock signal terminal CK1 to control the second switch transistor M2 to be turned off. The turned-on eighth switch transistor M8 electrically connects the reference voltage signal terminal Vref with the drive signal output terminal Output so that the storage capacitor Cst is charged, and the drive signal output terminal Output outputs a scan signal at a low level. Although at this time the turned-on third switch transistor M3 provides the control electrode of the fourth switch transistor M4 with the high-level signal of the second clock signal terminal Ck2 to control the fourth switch transistor M4 to be turned on, and to provide the drive signal output terminal Output with the high-level signal of the second clock signal terminal CK2, but since the second clock signal terminal CK2 is connected directly with the reference voltage signal terminal Vref, the signal of the second clock signal terminal CK2 cannot affect the signal of the drive signal output terminal Output. With Reset=0, the sixth switch transistor M6 is turned off.

In the period T22, Input=0, Reset=0, CK1=0, and CK2=1. With Input=0, both the fifth switch transistor M5 and the eighth switch transistor M8 are turned off. With Reset=0, the sixth switch transistor M6 is turned off. Since the first node N1 is floating, and due to bootstrapping of the storage capacitor Cst, the level at the first node N1 can be maintained at a high level to control all of the first switch transistor M1, the third switch transistor M3, the twelfth switch transistor M12, and the thirteenth switch transistor M13 to be turned on. The turned-on third switch transistor M3 provides the control electrode of the fourth switch transistor M4 with the high-level signal of the second clock signal terminal CK2 to control the fourth switch transistor M4 to be turned on, and to provide the drive signal output terminal Output with the high-level signal of the second clock signal terminal CK2. Due to bootstrapping of the storage capacitor Cst, the level at the first node N1 is further pulled up to control all of the first switch transistor M1, the third switch transistor M3, the twelfth switch transistor M12, and the thirteenth switch transistor M13 to be turned on completely. The turned-on twelfth switch transistor M12 provides the control electrode of the eleventh switch transistor M11 with the low-level signal of the reference voltage signal terminal Vref to control the eleventh switch transistor M1 to be turned off. The turned-on thirteenth switch transistor M13 provides the second node N2 with the low-level signal of the reference voltage signal terminal Vref so that the signal of the second node N2 is a low-level signal to control both the seventh switch transistor M7 and the ninth switch transistor M9 to be turned off. The turned-on first switch transistor M1 provides the control electrode of the second switch transistor M2 with the low-level signal of the first clock signal terminal CK1 to control the second switch transistor M2 to be turned off. The turned-on third switch transistor M3 provides the control electrode of the fourth switch transistor M4 with the high-level signal of the second clock signal terminal CK2 without any voltage loss to control the fourth switch transistor M4 to be turned on completely, and to provide the drive signal output terminal Output with the high-level signal of the second clock signal terminal CK2 without any voltage loss so that the drive signal output terminal Output outputs a scan signal at a high level.

In the period T23, Input=0, Reset=, CK1=0, and CK2=1. An operating process in this period is substantially the same as the operating process in the period T13, so a repeated description thereof will be omitted here.

In the period T24, Input=0, Reset=0, CK1=0, and CK2=1. An operating process in this period is substantially the same as the operating process in the period T14, so a repeated description thereof will be omitted here.

In the period T2, the operating process in the period T24 is repeated after the period T24 until the signal of the input signal terminal Input is changed again to a high-level signal.

In the first embodiment, the second switch transistor M2 and the fourth switch transistor M4 can alternately form a channel for outputting a high-level signal, at a two-second interval of time so that the characteristics of the second switch transistor M2 and the fourth switch transistor M4 can be resumed alternately to thereby alleviate the drifting characteristics of the second switch transistor M2 and the fourth switch transistor M4 from affecting the stability and the service lifetime of the display panel, so as to improve the service lifetime of the product, and to lower a production cost thereof, to some extent. Furthermore since the control electrodes of the first switch transistor M1 and the third switch transistor M3 are connected respectively with the first node N1, the control electrodes of the second switch transistor M2 and the fourth switch transistor M4 can be avoided from being biased by the first node N1 all the time, which would otherwise affect the characteristics of the transistors, to thereby improve the stability of an output signal.

Second Embodiment

Figure 4B:
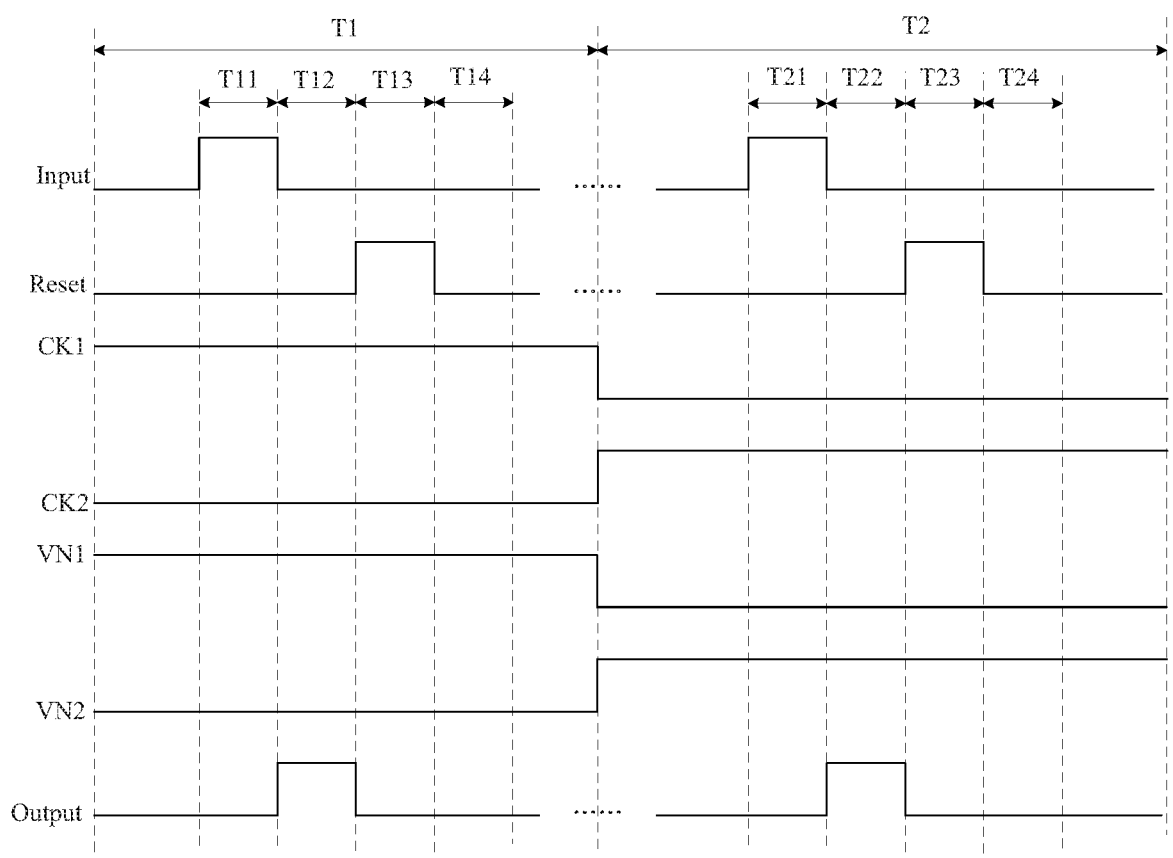
FIG. 4b is an input-output timing diagram corresponding to the shift register as illustrated in FIG. 3b.

Taking the shift register as illustrated in FIG. 3b as an example, all the transistors are N-type transistors; the signal of the reference voltage signal terminal Vref is a low-level signal, the signal of the first node control signal terminal VN1 is the same as the signal of the first clock signal terminal CK1, and the signal of the second node control signal terminal VN2 is the same as the signal of the second clock signal terminal CK2; and FIG. 4b illustrates a corresponding input-output timing diagram. Specifically there are two selected periods T1 and T2 in the corresponding input-output timing diagram as illustrated in FIG. 4b, where the period T1 and the period T2 correspond respectively to two seconds in a cycle of the signal of the first clock signal terminal CK1. Furthermore there are four selected periods T11, T12, T13, and T14 in a time period for displaying one frame in the period T1, and four selected periods T21, T22, T23, and T24 in a time period for displaying one frame in the period T2.

In the period T11, Input=11, Reset=0, CK1=1, CK2=0, VN1=1, VN2=0. In this period, with VN2=0, the fifteenth switch transistor M15 is turned off. The signal of the first node N1 further controls both the seventeenth switch transistor M17 and the eighteenth switch transistor M18 to be turned on. The turned-on seventeenth switch transistor M17 provides the sixteenth switch transistor M16 with the low-level signal of the reference voltage signal terminal Vref to control the sixteenth switch transistor M16 to be turned off. The turned-on eighteenth switch transistor M18 provides the third node N3 with the low-level signal of the reference voltage signal terminal Vref so that the signal of the third node N3 is a low-level signal to control both the fourteenth switch transistor M14 and the nineteenth switch transistor M19 to be turned off. The remaining operating process in this period is substantially the same as the operating process in the T11 period in the first embodiment, so a repeated description thereof will be omitted here.

In the period T12, Input=0, Reset=0, CK1=1, CK2=0, VN1=1, VN2=0. In this period, with VN2=0, the fifteenth switch transistor M15 is turned off. The signal of the first node N1 which is further pulled up further controls both the seventeenth switch transistor M17 and the eighteenth switch transistor M18 to be turned on. The turned-on seventeenth switch transistor M17 provides the sixteenth switch transistor M16 with the low-level signal of the reference voltage signal terminal Vref to control the sixteenth switch transistor M16 to be turned off. The turned-on eighteenth switch transistor M18 provides the third node N3 with the low-level signal of the reference voltage signal terminal Vref so that the signal of the third node N3 is a low-level signal to control both the fourteenth switch transistor M14 and the nineteenth switch transistor M19 to be turned off. The remaining operating process in this period is substantially the same as the operating process in the T12 period in the first embodiment, so a repeated description thereof will be omitted here.

In the period T13, Input=0, Reset=1, CK1=1, CK2=0, VN1=1, VN2=0. In this period, the signal of the first node N1 further controls both the seventeenth switch transistor M17 and the eighteenth switch transistor M18 to be turned off. With VN2=0, the fifteenth switch transistor M15 is turned off so that the signal of the third node N3 is maintained at a low level to control the fourteenth switch transistor M14 and the nineteenth switch transistor M19 to be turned off. The remaining operating process in this period is substantially the same as the operating process in the T13 period in the first embodiment, so a repeated description thereof will be omitted here.

In the period T14, Input=0, Reset=0, CK1=1, CK2=0, VN1=1, VN2=0. In this period, the signal of the first node N1 further controls both the seventeenth switch transistor M17 and the eighteenth switch transistor M18 to be turned off. With VN2=0, the fifteenth switch transistor M15 is turned off so that the signal of the third node N3 is maintained at a low level to control the fourteenth switch transistor M14 and the nineteenth switch transistor M19 to be turned off. The remaining operating process in this period is substantially the same as the operating process in the T14 period in the first embodiment, so a repeated description thereof will be omitted here.

In the period T1, the operating process in the period T14 is repeated after the period T14 until the signal of the input signal terminal Input is changed again to a high-level signal.

In the period T21, Input=1, Reset=0, CK1=0, CK2=1, VN1=0, VN2=1. In this period, with Reset=0, the twentieth switch transistor M20 is turned off. With VN1=0, the tenth switch transistor M10 is turned off. The signal of the first node N1 further controls both the seventeenth switch transistor M17 and the eighteenth switch transistor M18 to be turned on. The turned-on seventeenth switch transistor M17 provides the sixteenth switch transistor M16 with the low-level signal of the reference voltage signal terminal Vref to control the sixteenth switch transistor M16 to be turned off. The turned-on eighteenth switch transistor M18 provides the third node N3 with the low-level signal of the reference voltage signal terminal Vref so that the signal of the third node N3 is a low-level signal to control both the fourteenth switch transistor M14 and the nineteenth switch transistor M19 to be turned off. The remaining operating process in this period is substantially the same as the operating process in the T21 period in the first embodiment, so a repeated description thereof will be omitted here.

In the period T22, Input=0, Reset=0, CK1=0, CK2=1, VN1=0, VN2=1. In this period, with Reset=0, the twentieth switch transistor M20 is turned off. With VN1 1=0, the tenth switch transistor M10 is turned off. The further pulled up signal of the first node N1 controls both the seventeenth switch transistor M17 and the eighteenth switch transistor M18 to be turned on. The turned-on seventeenth switch transistor M17 provides the sixteenth switch transistor M16 with the low-level signal of the reference voltage signal terminal Vref to control the sixteenth switch transistor M16 to be turned off. The turned-on eighteenth switch transistor M18 provides the third node N3 with the low-level signal of the reference voltage signal terminal Vref so that the signal of the third node N3 is a low-level signal to control both the fourteenth switch transistor M14 and the nineteenth switch transistor M19 to be turned off. The remaining operating process in this period is substantially the same as the operating process in the T22 period in the first embodiment, so a repeated description thereof will be omitted here.

In the period T23, Input=0, Reset=1, CK1=0, CK2=1, VN1=0, VN2=1. In this period, with VN1=0, the tenth switch transistor M10 is turned off so that the signal of the second node N2 is maintained at a low level to control both the ninth switch transistor M9 and the seventh switch transistor M7 to be turned off. With VN2=1, the fifteenth switch transistor M15 is turned on, and provides the third node N3 with the high-level signal of the second node control signal terminal VN2 so that the signal of the third node N3 is a high-level signal to control both the fourteenth switch transistor M14 and the nineteenth switch transistor M19 to be turned on. The turned-on fourteenth switch transistor M14 provides the first node N1 with the low-level signal of the reference voltage signal terminal Vref so that the signal of the first node N1 is further a low-level signal to further control all of the first switch transistor M1, the third switch transistor M3, the twelfth switch transistor M12, the thirteenth switch transistor M13, the seventeenth switch transistor M17, and the eighteenth switch transistor M18 to be turned off. The turned-on nineteenth switch transistor M19 provides the drive signal output terminal Output with the low-level signal of the reference voltage signal terminal Vref so that the drive signal output terminal Output outputs a scan signal at a low level. With Reset=1, the twentieth switch transistor M20 is turned on, and provides the drive signal output terminal Output with the low-level signal of the reference voltage signal terminal Vref so that the drive signal output terminal Output further outputs a scan signal at a low level. The remaining operating process in this period is substantially the same as the operating process in the T23 period in the first embodiment, so a repeated description thereof will be omitted here.

In the period T24, Input=0, Reset=0, CK1=0, CK2=1, VN1=0, VN2=1. In this period, with Reset=0, the twentieth switch transistor M20 is turned off. With VN1=0, the tenth switch transistor M10 is turned off so that the signal of the second node N2 is maintained at a low level to control both the ninth switch transistor M9 and the seventh switch transistor M7 to be turned off. With VN2=1, the fifteenth switch transistor M15 is turned on, and provides the third node N3 with the high-level signal of the second node control signal terminal VN2 so that the signal of the third node N3 is a high-level signal to control both the fourteenth switch transistor M14 and the nineteenth switch transistor M19 to be turned on. The turned-on fourteenth switch transistor M14 provides the first node N1 with the low-level signal of the reference voltage signal terminal Vref so that the signal of the first node N1 is a low-level signal to control all of the first switch transistor M1, the third switch transistor M3, the twelfth switch transistor M12, the thirteenth switch transistor M13, the seventeenth switch transistor M17, and the eighteenth switch transistor M18 to be turned off. The turned-on nineteenth switch transistor M19 provides the drive signal output terminal Output with the low-level signal of the reference voltage signal terminal Vref so that the drive signal output terminal Output outputs a scan signal at a low level. The remaining operating process in this period is substantially the same as the operating process in the T24 period in the first embodiment, so a repeated description thereof will be omitted here.

In the period T2, the operating process in the period T24 is repeated after the period T24 until the signal of the input signal terminal Input is changed again to a high-level signal.

In the second embodiment, in the period T1, the seventh switch transistor M7, the ninth switch transistor M9, the tenth switch transistor M10, the eleventh switch transistor M11, the twelfth switch transistor M12, and the thirteenth switch transistor M13 operate, and in the period T2, the fourteenth switch transistor M14, the fifteenth switch transistor M15, the sixteenth switch transistor M16, the seventeenth switch transistor M17, the eighteenth switch transistor M18, and the nineteenth 19 operate, so that the characteristics of the transistors can be resumed alternately to thereby alleviate the drifting characteristics of the operating transistors from affecting the stability and the service lifetime of the display panel, so as to improve the service lifetime of the product, and to lower a production cost thereof, to some extent.

Based upon the same inventive idea, an embodiment of this disclosure further provides a method for driving the shift register above, where the method includes inputting signals with the same cycle, and opposite phases to the first clock signal terminal CK1 and the second clock signal terminal CK2.

In this way, the signals can be input respectively to the first clock signal terminal CK1 and the second clock signal terminal CK2 by only two signal lines so that each shift register SR(n) can output a shifted scan signal. As compared with the related art in which corresponding signals are input to the shift registers by six clock signal lines, the circuit design can be simplified, the number of wires on a Printed Circuit Board (PCB) can be reduced, the area of the PCB can be reduced, and the cost thereof can be lowered.

Figure 5A:
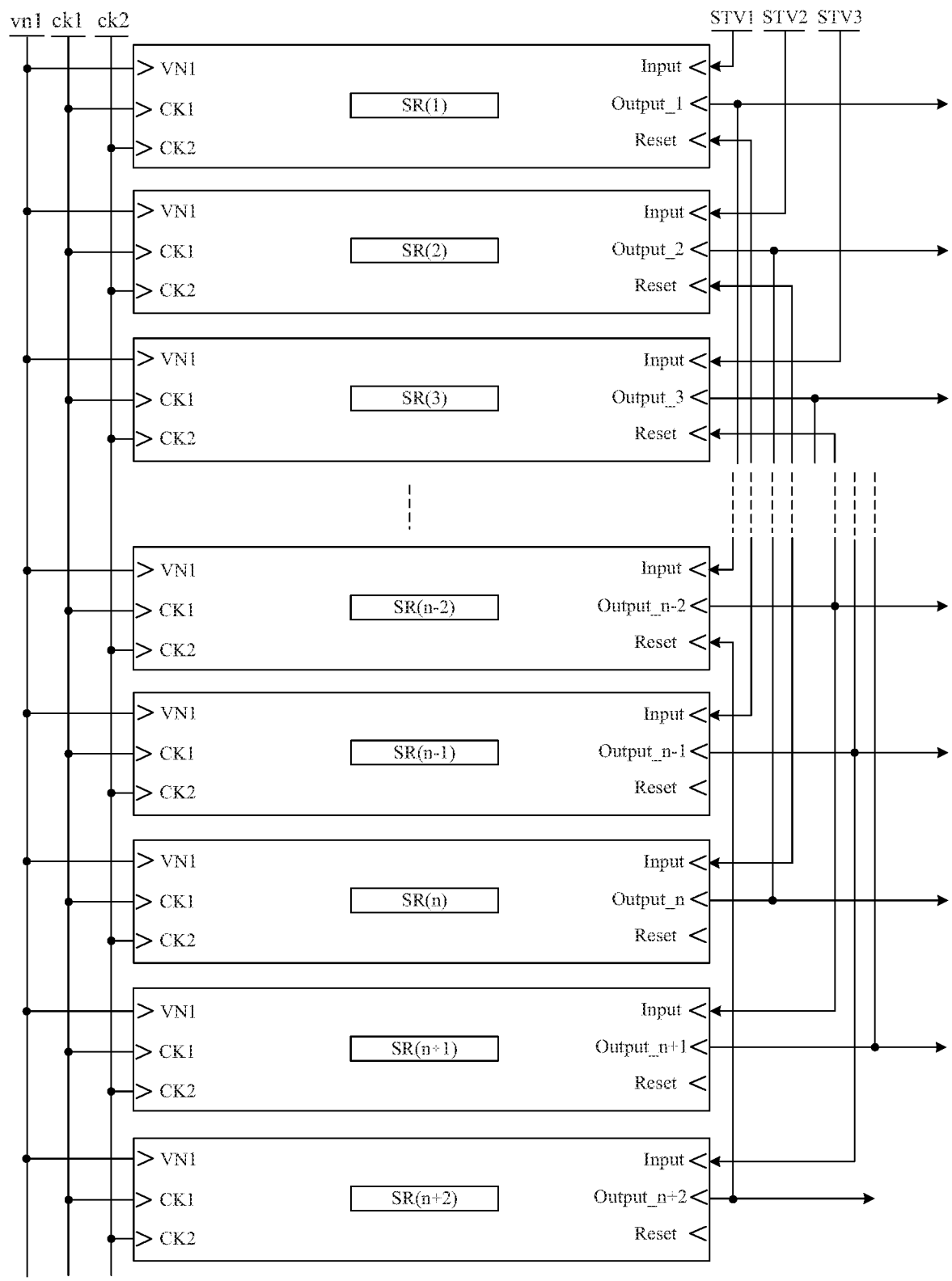
FIG. 5a is a schematic structural diagram of a gate driver circuit according to some embodiments of this disclosure.
Figure 5B:
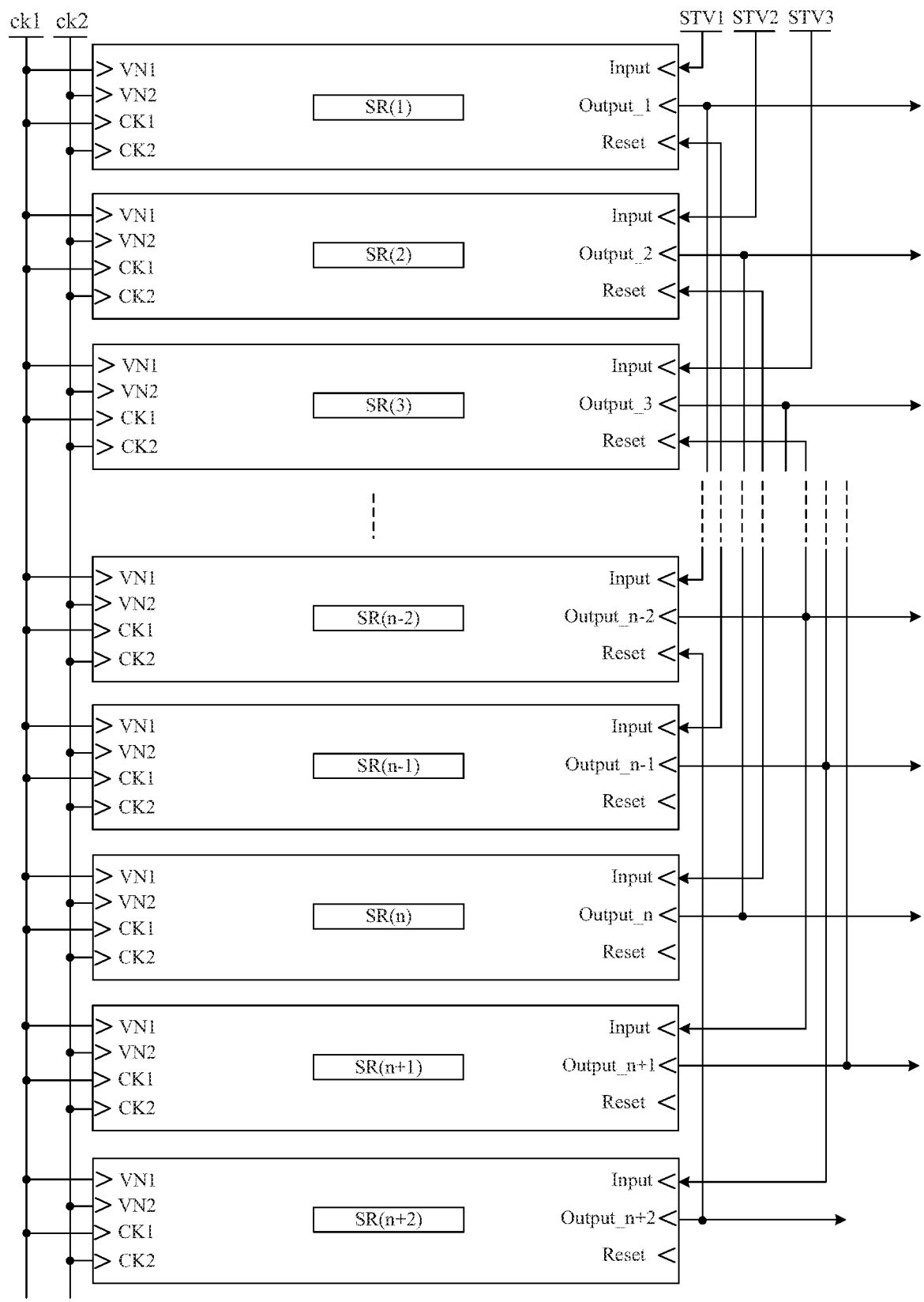
FIG. 5b is a schematic structural diagram of a gate driver circuit according to some embodiments of this disclosure.

Based upon the same inventive idea, an embodiment of this disclosure further provides a gate driver circuit as illustrated in FIG. 5a and FIG. 5b, which includes a plurality of cascaded shift registers according to the embodiments of this disclosure: SR(1), SR(2), SR(3), . . . , SR(n-2), SR(n-1), SR(n), SR(n+1), SR(n+2) (N shift registers in total, where 1≤n≤N, and N is a positive integer).

The input signal terminal Input of the first stage of the shift register SR(I) is connected with a first frame trigger signal terminal STV1.

The input signal terminal Input of the second stage of shift register SR(2) is connected with a second frame trigger signal terminal STV2.

The input signal terminal Input of the third stage of shift register SR(3) is connected with a third frame trigger signal terminal STV3.

Of every four adjacent shift registers, the input signal terminal of the fourth shift register is connected with the drive signal output terminal of the first shift register.

Of every five adjacent shift registers, the reset signal terminal of the first shift register is connected with the drive signal output terminal of the fifth shift register.

Specifically each shift register in the gate driver circuit above is functionally and structurally the same as the shift register according to the embodiment of this disclosure, so a repeated description thereof will be omitted here.

Optionally in the gate driver circuit according to the embodiment of this disclosure, as illustrated in FIG. 5a and FIG. 5b, the first clock signal terminal CK1 of each stage of shift register SR(n) is connected with the same clock terminal, i.e., the first clock terminal ck1, and the second clock signal terminal CK2 of each stage of shift register SR(n) is connected with the same clock terminal, i.e., the second clock terminal ck2.

In this way, the signals can be input respectively to the first clock signal terminal CK1 and the second clock signal terminal CK2 of each stage of shift register SR(n) by only two signal lines so that each stage of shift register SR(n) can output a shifted scan signal. As compared with the related art in which corresponding signals are input to the shift registers by six clock signal lines, the circuit design can be simplified, the number of wires on a Printed Circuit Board (PCB) can be reduced, the area of the PCB can be reduced, and the cost thereof can be lowered.

In a specific implementation, in the gate driver circuit according to the embodiment of this disclosure, the reference voltage signal terminal Vref of each stage of shift register is connected with the same reference signal terminal.

In a specific implementation, when the shift register includes the second control circuit 5, in the gate driver circuit according to the embodiment of this disclosure, the first node control signal terminal VN1 of each stage of the shift register is connected with the same first control terminal, and the second node control signal terminal VN2 of each stage of the shift register is connected with the same second control terminal.

Optionally when the shift register includes the second control circuit 5, for each shift register, the first node control signal terminal VN1 can be the same signal terminal as the first clock signal terminal CK1, and the second node control signal terminal VN2 can be the same signal terminal as the second clock signal terminal CK2. In the gate driver circuit according to the embodiment of this disclosure, as illustrated in FIG. 5b, the first node control signal terminal VN1 of each stage of shift register SR(n) is connected with the same first clock terminal ck1, and the second node control signal terminal VN2 of each stage of shift register SR(n) is connected with the same second clock terminal ck2, thus further reducing the number of signal lines.

Based upon the same inventive idea, an embodiment of this disclosure further provides a display device including the gate driver circuit above according to any one of the embodiments of this disclosure. The display device can be a mobile phone, a tablet computer, a TV set, a monitor, a notebook computer, a digital photo frame, a navigator, or any other product or component with a display function. Reference can be made to the embodiment of the gate driver circuit above for an implementation of the display device, so a repeated description thereof will be omitted here.

In the shift register, the gate driver circuit, and the display device according to the embodiments of this disclosure, the first output circuit includes two output channels, where one channel is that under the joint control of the signals of the first clock signal terminal and the first node, the signal of the first clock signal terminal is provided to the drive signal output terminal of the shift register, and the other channel is that under the joint control of the signals of the second clock signal terminal and the first node, the signal of the second clock signal terminal is provided to the drive signal output terminal, and the first output circuit cooperates with the other four circuits so that these two channels can operate alternately to thereby avoid current from flowing through only one of the channels so as to improve the service lifetime of the shift register.

Evidently those skilled in the art can make various modifications and variations to the invention without departing from the spirit and scope of this disclosure. Thus the invention is also intended to encompass these modifications and variations thereto so long as the modifications and variations come into the scope of the claims appended to the invention and their equivalents.

The invention claimed is:

1. A shift register, comprising:
an input circuit configured to provide a first node with a signal of an input signal terminal under the control of the input signal terminal;
a reset circuit configured to provide the first node with a signal of a reference voltage signal terminal under the control of a reset signal terminal;
a first control circuit configured to control a level at the first node, and a level at a second node;
a first output circuit configured to provide a drive signal output terminal of the shift register with a signal of a first clock signal terminal under the joint control of the signal of the first clock signal terminal and a signal of the first node, and to provide the drive signal output terminal with a signal of a second clock signal terminal under the joint control of the signal of the second clock signal terminal and the signal of the first node, wherein the signal of the first clock signal terminal and the signal of the second clock signal terminal have a same cycle, and opposite phases; and
a second output circuit configured to provide the drive signal output terminal with the signal of the reference voltage signal terminal respectively under the control of the signal of the input signal terminal and a signal of the second node,
wherein the first output circuit comprises a first switch transistor, a second switch transistor, a third switch transistor, a fourth switch transistor, and a storage capacitor, wherein:
the first switch transistor has a control electrode connected with the first node, a first electrode connected with the first clock signal terminal, and a second electrode connected with a control electrode of the second switch transistor;
the second switch transistor has a first electrode connected with the first clock signal terminal, and a second electrode connected with the drive signal output terminal;
the third switch transistor has a control electrode connected with the first node, a first electrode connected with the second clock signal terminal, and a second electrode connected with a control electrode of the fourth switch transistor;
the fourth switch transistor has a first electrode connected with the second clock signal terminal, and a second electrode connected with the drive signal output terminal; and
the storage capacitor is connected between the first node and the drive signal output terminal.

2. The shift register according to claim 1, wherein the input circuit comprises a fifth switch transistor, wherein the fifth switch transistor has a control electrode and a first electrode, both of which are connected with the input signal terminal, and a second electrode connected with the first node.

3. The shift register according to claim 1, wherein the reset circuit comprises a sixth switch transistor, wherein the sixth switch transistor has a control electrode connected with the reset signal terminal, a first electrode connected with the reference voltage signal terminal, and a second electrode connected with the first node.

4. The shift register according to claim 1, wherein the second output circuit comprises a seventh switch transistor and an eighth switch transistor, wherein:
the seventh switch transistor has a control electrode connected with the second node, a first electrode connected with the reference voltage signal terminal, and a second electrode connected with the drive signal output terminal; and
the eighth switch transistor has a control electrode connected with the input signal terminal, a first electrode connected with the reference voltage signal terminal, and a second electrode connected with the drive signal output terminal.

5. The shift register according to claim 1, wherein the first control circuit comprises a ninth switch transistor, a tenth switch transistor, an eleventh switch transistor, a twelfth switch transistor, and a thirteenth switch transistor, wherein:
the ninth switch transistor has a control electrode connected with the second node, a first electrode connected with the reference voltage signal terminal, and a second electrode connected with the first node;
the tenth switch transistor has a control electrode and a first electrode, both of which are connected with a first node control signal terminal, and a second electrode connected with a control electrode of the eleventh switch transistor;
the eleventh switch transistor has a first electrode connected with the first node control signal terminal, and a second electrode connected with the second node;
the twelfth switch transistor has a control electrode connected with the first node, a first electrode connected with the reference voltage signal terminal, and a second electrode connected with the control electrode of the eleventh switch transistor; and
the thirteenth switch transistor has a control electrode connected with the first node, a first electrode connected with the reference voltage signal terminal, and a second electrode connected with the second node.

6. The shift register according to claim 1, wherein the signal of the first clock signal terminal has a cycle of four seconds, and a duty cycle of 50%.

7. The shift register according to claim 1, wherein the shift register further comprises a second control circuit and a third output circuit, wherein:
the second control circuit is configured to control the level at the first node, and a level at a third node; and
the third output circuit is configured to provide the drive signal output terminal with the signal of the reference voltage signal terminal under the control of the signal of the third node.

8. The shift register according to claim 7, wherein the second control circuit comprises a fourteenth switch transistor, a fifteenth switch transistor, a sixteenth switch transistor, a seventeenth switch transistor, and an eighteenth switch transistor, wherein:
the fourteenth switch transistor has a control electrode connected with the third node, a first electrode connected with the reference voltage signal terminal, and a second electrode connected with the first node;
the fifteenth switch transistor has a control electrode and a first electrode, both of which are connected with a second node control signal terminal, and a second electrode connected with a control electrode of the sixteenth switch transistor;
the sixteenth switch transistor has a first electrode connected with the second node control signal terminal, and a second electrode connected with the third node;
the seventeenth switch transistor has a control electrode connected with the first node, a first electrode connected with the reference voltage signal terminal, and a second electrode connected with the control electrode of the sixteenth switch transistor; and
the eighteenth switch transistor has a control electrode connected with the first node, a first electrode connected with the reference voltage signal terminal, and a second electrode connected with the third node.

9. The shift register according to claim 7, wherein the third output circuit comprises a nineteenth switch transistor, wherein:
the nineteenth switch transistor has a control electrode connected with the third node, a first electrode connected with the reference voltage signal terminal, and a second electrode connected with the drive signal output terminal.

10. The shift register according to claim 1, wherein the shift register further comprises an output stabilizing circuit configured to provide the drive signal output terminal with the signal of the reference voltage signal terminal under the control of the reset signal terminal.

11. The shift register according to claim 10, wherein the output stabilizing circuit comprises a twentieth switch transistor, wherein:
the twentieth switch transistor has a control electrode connected with the reset signal terminal, a first electrode connected with the reference voltage signal terminal, and a second electrode connected with the drive signal output terminal.

12. A method for driving the shift register according to claim 1, the method comprising:
inputting signals with a same cycle and opposite phases to the first clock signal terminal and the second clock signal terminal.

13. A gate driver circuit, comprising a plurality of cascaded shift registers according to claim 1, wherein:
an input signal terminal of a first stage of the shift register is connected with a first frame trigger signal terminal;
an input signal terminal of a second stage of the shift register is connected with a second frame trigger signal terminal;
an input signal terminal of a third stage of the shift register is connected with a third frame trigger signal terminal;
of every four adjacent shift registers, an input signal terminal of a fourth shift register is connected with the drive signal output terminal of a first shift register; and
of every five adjacent shift registers, a reset signal terminal of the first shift register is connected with the drive signal output terminal of a fifth shift register.

14. The gate driver circuit according to claim 13, wherein a first clock signal terminal of each stage of the shift register is connected with a first clock terminal, and a second clock signal terminal of each stage of the shift register is connected with a second clock terminal.

15. A display device, comprising the gate driver circuit according to claim 13.

16. The shift register according to claim 1, wherein the first control circuit comprises a ninth switch transistor, a tenth switch transistor, an eleventh switch transistor, a twelfth switch transistor, and a thirteenth switch transistor, wherein:
the ninth switch transistor has a control electrode connected with the second node, a first electrode connected with the reference voltage signal terminal, and a second electrode connected with the first node;

the tenth switch transistor has a control electrode and a first electrode, both of which are connected with a first node control signal terminal, and a second electrode connected with a control electrode of the eleventh switch transistor;

the eleventh switch transistor has a first electrode connected with the first node control signal terminal, and a second electrode connected with the second node;

the twelfth switch transistor has a control electrode connected with the first node, a first electrode connected with the reference voltage signal terminal, and a second electrode connected with the control electrode of the eleventh switch transistor; and the thirteenth switch transistor has a control electrode connected with the first node, a first electrode connected with the reference voltage signal terminal, and a second electrode connected with the second node;

wherein the shift register further comprises a second control circuit and a third output circuit, wherein:

the second control circuit is configured to control the level at the first node, and a level at a third node; and the third output circuit is configured to provide the drive signal output terminal with the signal of the reference voltage signal terminal under the control of the signal of the third node;

wherein the second control circuit comprises a fourteenth switch transistor, a fifteenth switch transistor, a sixteenth switch transistor, a seventeenth switch transistor, and an eighteenth switch transistor, wherein:

the fourteenth switch transistor has a control electrode connected with the third node, a first electrode connected with the reference voltage signal terminal, and a second electrode connected with the first node;

the fifteenth switch transistor has a control electrode and a first electrode, both of which are connected with a second node control signal terminal, and a second electrode connected with a control electrode of the sixteenth switch transistor;

the sixteenth switch transistor has a first electrode connected with the second node control signal terminal, and a second electrode connected with the third node;

the seventeenth switch transistor has a control electrode connected with the first node, a first electrode connected with the reference voltage signal terminal, and a second electrode connected with the control electrode of the sixteenth switch transistor; and the eighteenth switch transistor has a control electrode connected with the first node, a first electrode connected with the reference voltage signal terminal, and a second electrode connected with the third node.

17. The shift register according to claim 16, wherein a signal of the first node control signal terminal, and a signal of the second node control signal terminal are clock signals; and the signal of the first node control signal terminal and the signal of the second node control signal terminal have a same cycle, and opposite phases.

* * * * *